(12) United States Patent
Tsai et al.

(10) Patent No.: US 8,843,357 B2
(45) Date of Patent: Sep. 23, 2014

(54) ELECTRICAL CONNECTION DEFECT SIMULATION TEST METHOD AND SYSTEM OF THE SAME

(75) Inventors: Su-Wei Tsai, Taipei (TW); Ming-Hsien Liu, New Taipei (TW)

(73) Assignee: TEST Research, Inc. (TW)

( * ) Notice: Subject to any disclaimer, the term of this patent is extended or adjusted under 35 U.S.C. 154(b) by 502 days.

(21) Appl. No.: 13/039,843

(22) Filed: Mar. 3, 2011

(65) Prior Publication Data

US 2012/0173214 A1 Jul. 5, 2012

(30) Foreign Application Priority Data

Dec. 30, 2010 (TW) .............................. 99146953 A

(51) Int. Cl.
*G06F 17/50* (2006.01)
*G06F 9/455* (2006.01)
*G06G 7/62* (2006.01)
*G06F 11/26* (2006.01)
*G01R 31/3183* (2006.01)

(52) U.S. Cl.
CPC ...... *G06F 11/261* (2013.01); *G01R 31/318357* (2013.01)
USPC .................... 703/13; 703/23; 703/24; 703/28

(58) Field of Classification Search
CPC .................... G06F 11/261; G01R 31/318357; G01R 31/318314; G01R 31/31723
USPC .......................... 703/13, 23–24, 28
See application file for complete search history.

(56) References Cited

U.S. PATENT DOCUMENTS

| 5,270,642 | A | * | 12/1993 | Parker ........................... 714/727 |
| 5,303,246 | A | | 4/1994 | Anderson et al. |
| 5,510,704 | A | | 4/1996 | Parker et al. |
| 6,157,200 | A | * | 12/2000 | Okayasu .................. 324/754.23 |
| 6,429,676 | B1 | * | 8/2002 | Chun et al. ............... 324/762.02 |
| 6,487,700 | B1 | * | 11/2002 | Fukushima ................... 716/106 |
| 7,253,606 | B2 | * | 8/2007 | Loh et al. ................. 324/750.01 |
| 7,321,885 | B2 | * | 1/2008 | Loh ................................ 706/47 |
| 7,324,982 | B2 | * | 1/2008 | Loh et al. ........................ 706/47 |
| 7,800,386 | B2 | * | 9/2010 | Nakamura et al. ....... 324/754.03 |
| 7,855,567 | B2 | * | 12/2010 | Tsai et al. .................. 324/754.1 |
| 7,894,204 | B1 | * | 2/2011 | Mellick et al. ................ 361/778 |
| 2010/0188097 | A1 | | 7/2010 | Sul et al. |

FOREIGN PATENT DOCUMENTS

| CN | 2906793 | 5/2007 |
| CN | 10155143 | 10/2009 |
| CN | 10131411 | 12/2009 |
| EP | 0522413 | 1/1993 |

\* cited by examiner

*Primary Examiner* — Aniss Chad
(74) *Attorney, Agent, or Firm* — Merchant & Gould P.C.

(57) ABSTRACT

An electrical connection defect simulation test method is provided. The electrical connection state simulation test method includes the steps as follows. A device under test is provided, wherein the device under test includes a plurality of pin groups each having a plurality of signal pins. A zero-frequency signal is transmitted from a signal-feeding device to each of the signal pins to simulate an open condition. An open test is performed on each of the signal pins. The signal pins of the device under test are connected to a relay matrix. The relay matrix is controlled to make any two of the signal pins in one of the pin groups electrically connected to simulate a short condition. A short test is performed on any two of the electrically connected signal pins. An electrical connection state simulation test system is disclosed herein as well.

14 Claims, 4 Drawing Sheets

ELECTRICAL CONNECTION DEFECT SIMULATION TEST METHOD AND SYSTEM OF THE SAME

RELATED APPLICATIONS

This application claims priority to Taiwan Application Serial Number 099146953, filed Dec. 30, 2010, which is herein incorporated by reference.

BACKGROUND

1. Technical Field

The present disclosure relates to an electrical circuit test method and system. More particularly, the present disclosure relates to an electrical connection defect simulation test method and system of the same.

2. Description of Related Art

In the field of circuit testing, it is necessary to examine the validity of the test technology. In order to determine whether the test technology such as TestJet, Boundary-Scan or ToggleScan™ is able to detect the electrical connection defect on a device under test, a physical electrical connection defect has to be made on the pins of the device under test to allow the test technology to perform the detection.

However, before the physical electrical connection defect is made, one has to determine whether the pin is suitable for the simulation first because other modules may be damaged when the pin is cut off or when a desoldering process is performed on a soldering point. After the pin is determined to be an appropriate pin, a destructive method is used to simulate the open condition by cutting off the pin, by performing the desoldering process on the soldering point of the pin or by cutting off the wire between the device under test and the circuit board. The device under test may be damaged when the cutting process is performed, and the desoldering process can possibly make a permanent damage on device under test or the circuit board as well. On the other hand, the simulation of the short condition is often accomplished by soldering two or more pins together. It is also possible to do harm to the device under test or the soldering on the circuit board when the desoldering process is performed on the soldered pins to recover the device under test after the simulation. Furthermore, it is impossible to perform simulation on every pin of the device under test since there are more and more pins within a single device. A thorough simulation of the device under test is hard to realize.

Accordingly, what is needed is an electrical connection defect simulation test method and system of the same to address the above issue. The present disclosure addresses such a need.

SUMMARY

An aspect of the present disclosure is to provide an electrical connection defect simulation test method. The electrical connection defect simulation test method comprises the steps as follows. A device under test is provided, wherein the device under test comprises a plurality of pin groups each having a plurality of signal pins. A zero-frequency signal is transmitted from a signal-feeding device to each of the signal pins to simulate an open condition. An open test is performed on each of the signal pins. The signal pins of the device under test is connected to a relay matrix. The relay matrix is controlled to make any two of the signal pins in one of the pin groups electrically connected to simulate a short condition. A short test is performed on any two of the electrically connected signal pins.

Another aspect of the present disclosure is to provide an electrical connection defect simulation test system to perform a simulation test on a device under test, wherein the device under test comprises a plurality of pin groups each having a plurality of signal pins. The electrical connection defect simulation test system comprises a signal-feeding device and a relay matrix. The signal-feeding device transmits a zero-frequency signal from a signal-feeding device to each of the signal pins to simulate an open condition. The relay matrix is connected to the signal pins of the pin groups of the device under test to make any two of the signal pins in one of the pin groups substantially electrically connected to simulate a short condition.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
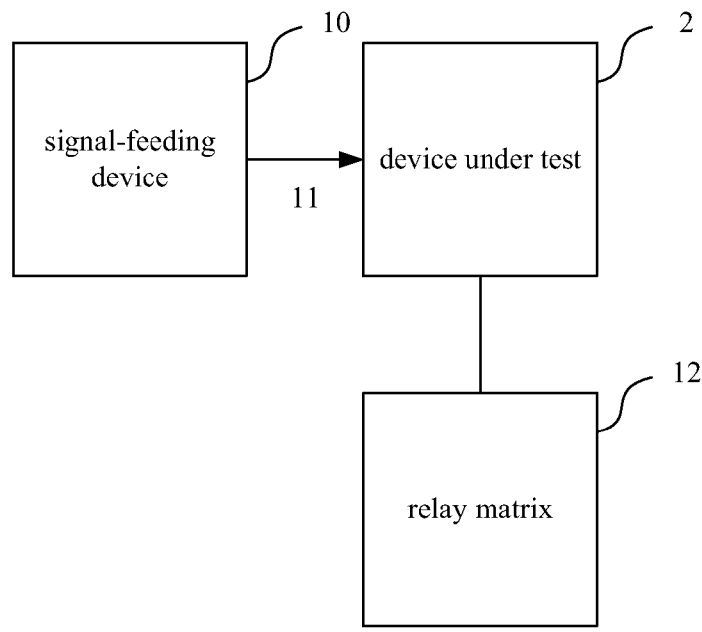
FIG. 1 is a diagram of an electrical connection defect simulation test system in an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Please refer to FIG. 1. FIG. 1 is a diagram of an electrical connection defect simulation test system 1 of an embodiment of the present disclosure. The electrical connection defect simulation test system 1 comprises a signal-feeding device 10 and a relay matrix 12. The electrical connection defect simulation test system 1 can simulate electrical connection defects such as open condition or short condition and perform a simulation test on a device under test 2.

Figure 2:
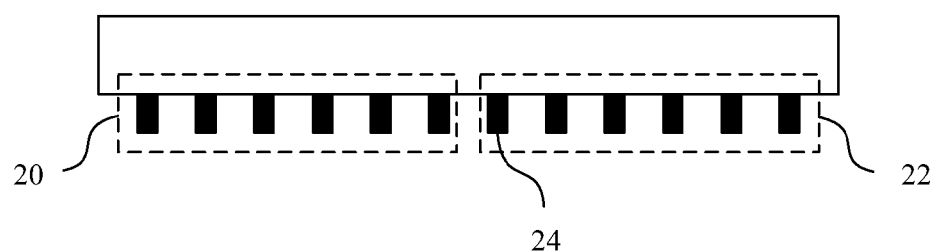
FIG. 2 is a side view of the device under test depicted in FIG. 1 in an embodiment of the present disclosure.

Please refer to FIG. 2. FIG. 2 is a side view of the device under test 2 in an embodiment of the present disclosure. In the present embodiment, the device under test 2 comprises two pin groups 20 and 22. Each pin groups 20 and 22 comprises a plurality of signal pins 24. In an embodiment, the signal pins 24 are categorized to pin groups 20 and 22 according to different electrical logic levels that the signal pins 24 have. The signal pins 24 in different pin groups 20 and 22 have electrical logic levels different to each other. For example, the electrical logic level to drive the signal pins 24 in the pin group 20 is 1.8 volt and the electrical logic level to drive the signal pins 24 in the pin group 22 is 3.3 volt. In other embodiments, the number of the pin groups, the number of signal pins in each of the pin group and the logic level of each of the pin group can be adjusted according to the different situations.

Please refer to FIG. 1 again. The signal-feeding device 10 transmits a zero-frequency signal 11 to each of the signal pins 24 of the device under test 2 to simulate an open condition on each of the signal pins 24. In an embodiment, the signal-feeding device 10 is a boundary scan chip. The boundary scan chip is connected to each signal pins 24 of the device under test 2 and is able to generate test signals to each signal pins 24 of the device under test 2. Hence, the signal-feeding device 10 is able to generate a zero-frequency signal 11 to each of the signal pins 24. It's noticed that the term 'zero-frequency' means that the oscillating frequency of the feeding-signal is in a range close to zero and is not limited to zero frequency only. For example, the zero-frequency signal 11 can be a direct current (DC) signal, which can be a high level DC signal maintaining at a high voltage level or a low level DC signal maintaining at a low voltage level. In another embodiment, the zero-frequency signal 11 can be a high impedance signal to generate a high level state, a low level state or a high impedance state.

Some test technologies determine whether the pin is open or not by detecting the frequency of the signal on the signal pins 24. When a signal pin 24 is in normal operation, a high frequency oscillation is detected by the test technologies described above due to the normal data signal transmission. On the other hand, when the signal pin 24 is open, the detected frequency becomes almost zero since there is no signal transmission on the signal pin 24. The zero-frequency signal 11 described above is a signal with a frequency close to or equal to zero, which is similar to the status of the signal pins 24 under the open condition. Consequently, by feeding the zero-frequency signal 11 to the signal pins 24, a simulation of the open condition of the signal pins 24 can be accomplished.

Figure 3:
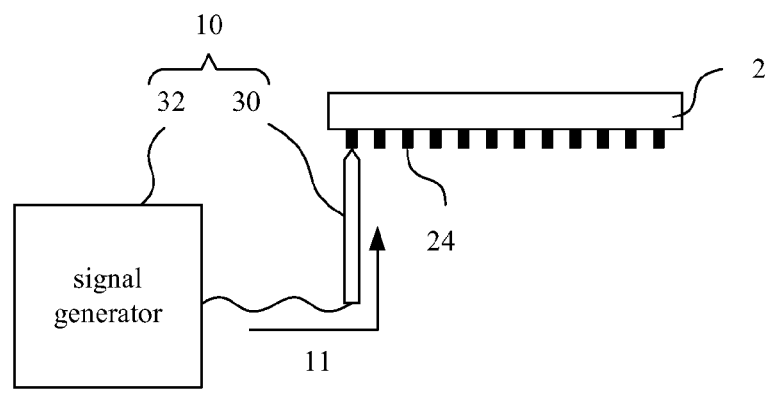
FIG. 3 is a side view of the signal-feeding device depicted in FIG. 1 and the device under test in an embodiment of the present disclosure.

Please refer to FIG. 3. FIG. 3 is a side view of the signal-feeding device 10 and the device under test 2 in an embodiment of the present disclosure. In the present embodiment, the signal-feeding device 10 comprises a probe 30 and a signal generator 32. The zero-frequency signal 11 is generated by the signal generator 32 and is transmitted to each of the signal pins 24 through the probe 30.

Accordingly, the signal-feeding device 10 of the electrical connection defect simulation test system 1 is able to transmit the zero-frequency signal 11 to the signal pins 24 to simulate the open condition of the signal pins 24. An open test is further performed on the device under test 2 to determine whether the electrical connection defect detection technology is able to detect the simulated open condition of the signal pins 24. In some embodiments, the electrical connection defect detection technology can be accomplished by test technologies such as TestJet, Boundary-Scan or ToggleScan™.

Figure 4:
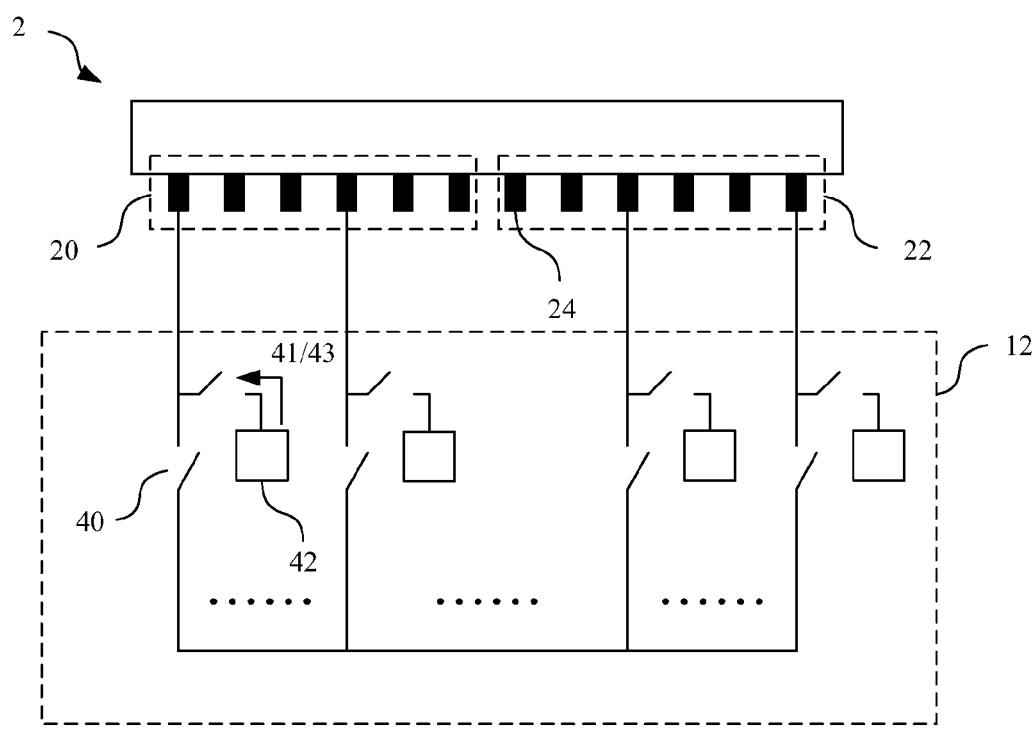
FIG. 4 is a diagram of the relay matrix of the electrical connection defect simulation test system and the device under test connected together in an embodiment of the present disclosure.

Please refer to FIG. 4. FIG. 4 is a diagram of the relay matrix 12 of the electrical connection defect simulation test system 1 and the device under test 2 connected together in an embodiment of the present disclosure. In an embodiment, the relay matrix 12 comprises a plurality of relays 40 and a plurality of pin drivers 42. Each of the relays 40 is corresponding to one of the pin drivers 42. The relays 40 of the relay matrix 12 are connected to the signal pins 24 of the pin groups 20 and 22. As described above, the pin groups 20 and 22 have different electrical logic levels (e.g. 1.8 volt and 3.3 volt). If the signal pins 24 in two different pin groups 20 and 22 are electrically connected together, the signal pins 24 may be damaged. Hence, the relay matrix 12 is controlled to make any two of the signal pins 24 of the same pin group 20 electrically connected to simulate the short condition between two signal pins 24 in the pin group 20. Similarly, the relay matrix 12 is controlled to make any two of the signal pins 24 of the same pin group 22 electrically connected to simulate the short condition between two signal pins 24 in the pin group 22.

Consequently, any two of the signal pins 24 within the same n-th pin group can perform the short simulation using the algorithm shown below:

```
//Pin group n
for (i=1; i<=total number of pins in the pin group; i++)
    {
        for (j=1; j<= total number of pins in the pin group; j++)
            {
                if (j≠ i)
                    pin to be shorted=j
            }
        under test pin=i
    }
``` wherein the "pin to be shorted" is the pin that is supposed to perform short simulation with the under test pin.

Each of the pin drivers 42 can further provide a simulated power signal 41 to the corresponding signal pins 24. When the relays 40 in the relay matrix 12 makes two signal pins 24 electrically connected and the pin driver 42 provides the simulated power signal 41 to at least one of the two electrically connected signal pins 24, a power-short condition can be simulated, wherein the power-short condition is a short condition generated between a signal pin and a power pin. Moreover, the voltage level of the simulated power signal 41 has to be the same with the electrical logic level of these two signal pins 24 to avoid the damage of the device under test 2. The advantage of using the pin driver 42 to simulate the power-short condition is that the pin driver 42 has a current-limiting mechanism to avoid the large current generated when the signal pin 24 is directly connected to the real power pin that may do harm to the signal pin 24.

In another embodiment, the pin drivers 42 can further provide a simulated ground signal 43 to the corresponding signal pins 24. The simulated ground signal 43 is a voltage signal close to or equal to 0 volt. When the relays 40 in the relay matrix 12 makes two signal pins 24 electrically connected and the pin driver 42 provides the simulated ground signal 43 to at least one of the two electrically connected signal pins 24, a ground-short condition can be simulated, wherein the ground-short condition is a short condition generated between a signal pin and a ground pin.

Accordingly, through the relay matrix 12 of the electrical connection defect simulation test system 1, the short condition simulation can be accomplished by electrically connecting any two of the signal pins 24 within the pin group 20 or within the pin group 22. Furthermore, the simulated power signal 41 or the simulated ground signal 43 can be fed to the signal pins 24 to simulate the short condition between the signal pin 24 and the power pin or between the signal pin 24 and the ground pin. The short test can be further performed on the device under test 2 to determine whether the electrical connection defect detection technology is able to detect the simulated short condition of the signal pins 24.

Figure 5A:
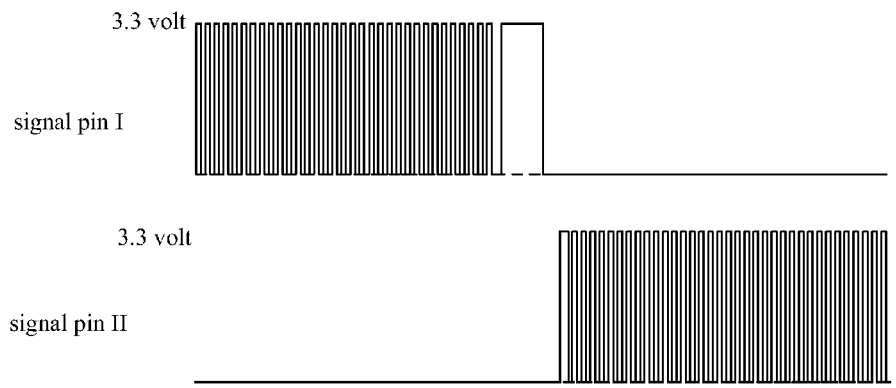
FIG. 5A is a diagram of the waveforms of the detected output signals of two of the signal pins when they are in normal operation.
Figure 5B:
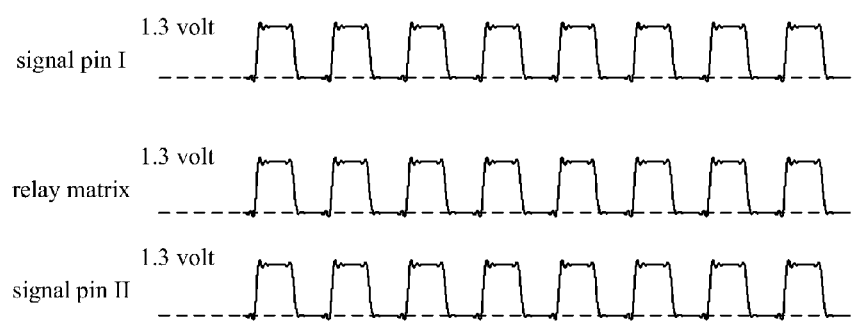
FIG. 5B is a diagram of the waveforms of the detected output signals of the two signal pins when the relay matrix is used to perform the short condition simulation.

Please refer to FIG. 5A and FIG. 5B. FIG. 5A is a diagram of the waveforms of the detected output signals of two of the signal pins 24 (depicted as signal pin I and signal pin II) when they are in normal operation. FIG. 5B is a diagram of the waveforms of the detected output signals of the two signal pins 24 when the relay matrix 12 is used to perform the short condition simulation. As shown in FIG. 5A, the signal pin I and signal pin II outputs two different signals when they are in normal operation, and the voltage levels of the two signals are both 3.3 volt. When the short condition is simulated, the signal pin I and signal pin II generate the same output signal and the voltage level of the output signal decays to 1.3 volt, as shown in FIG. 5B. Hence, the short condition is successfully simulated through the use of the relay matrix 12.

Figure 6:
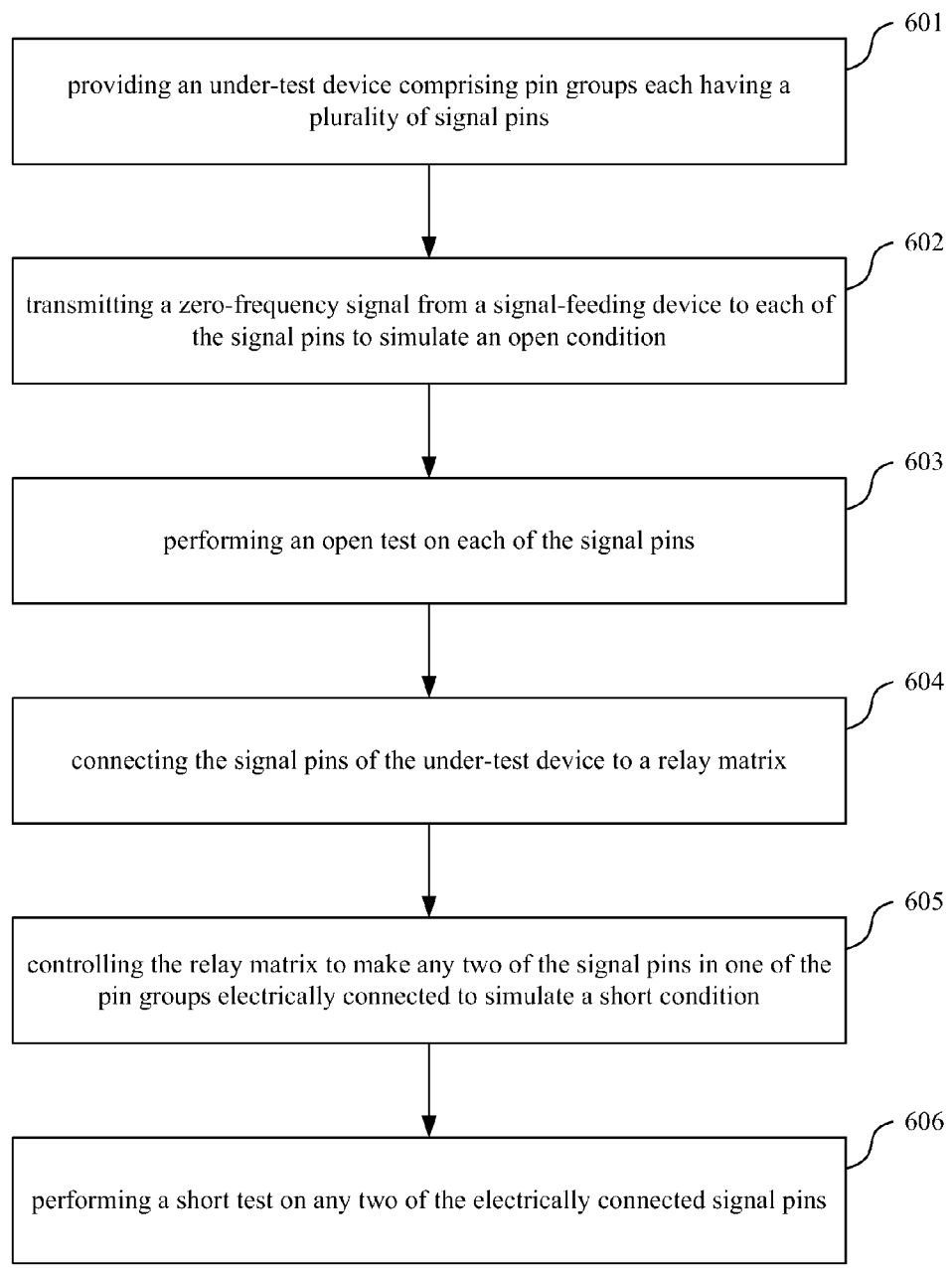
FIG. 6 is a flow chart of the electrical connection defect simulation test method in an embodiment of the present disclosure.

Please refer to FIG. 6. FIG. 6 is a flow chart of the electrical connection defect simulation test method in an embodiment of the present disclosure. The electrical connection defect simulation test method can be adapted to the electrical connection defect simulation test system 1 as depicted in FIG. 1. The electrical connection defect simulation test method comprises the steps as follows. (The steps are not recited in the sequence in which the steps are performed. That is, unless the sequence of the steps is expressly indicated, the sequence of the steps is interchangeable, and all or part of the steps may be simultaneously, partially simultaneously, or sequentially performed.)

In step 601, the device under test 2 is provided, wherein the device under test 2 comprises pin groups (e.g. the pin groups 20 and 22 depicted in FIG. 2) each having a plurality of signal pins 24. A zero-frequency signal 11 is transmitted from a signal-feeding device 10 to each of the signal pins 24 to simulate an open condition in step 602. An open test is performed on each of the signal pins 24 to determine whether the simulated open condition can be detected in step 603. Then in step 604, the signal pins 24 of the device under test 2 are connected to a relay matrix 12. The relay matrix 12 is controlled to make any two of the signal pins 24 in one of the pin groups 20 and 22 electrically connected to simulate a short condition in step 605. A short test is performed on any two of the electrically connected signal pins 24 to determine whether the simulated short condition can be detected in step 606.

It's noticed that the order of the simulation of the open condition and short condition can be reversed in different embodiments and is not limited by the order described above.

With the use of the electrical connection defect simulation test system 1, it does not need to remove the physical connection of the pins of the device under test, the soldering point of the circuit board or the physical connection of the wire between the circuit board and the device under test to accomplish the simulation of the open condition or the short condition. The electrical connection defect simulation test system 1 provides a non-destructive simulation method to avoid the damage that may occur to the pins of the device under test, the soldering point of the circuit board or the wire between the circuit board and the device under test.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrical connection defect simulation test method comprising the steps of:
    providing a device under test, wherein the device under test comprises a plurality of pin groups each having a plurality of signal pins, and the device under test is equipped with an electrical connection defect detection technology;
    transmitting a zero-frequency signal from a signal-feeding device to each of the signal pins to simulate an open condition;
    performing an open test on each of the signal pins by the device under test;
    connecting the signal pins of the device under test to a relay matrix;
    controlling the relay matrix to make any two of the signal pins in one of the pin groups electrically connected to simulate a short condition; and
    performing a short test on any two of the electrically connected signal pins by the device under test.

2. The electrical connection defect simulation test method of claim 1, wherein the pin groups have electrical logic levels different to each other.

3. The electrical connection defect simulation test method of claim 1, wherein the zero-frequency signal is a direct current (DC) signal or a tri-state signal.

4. The electrical connection defect simulation test method of claim 1, wherein the signal-feeding device comprises a probe and a signal generator, the zero-frequency signal is generated by the signal generator and is transmitted to each of the signal pins through the probe.

5. The electrical connection defect simulation test method of claim 1, wherein the signal-feeding device is a boundary scan chip connected to each of the signal pins, the zero-frequency signal is generated by the boundary scan chip.

6. The electrical connection defect simulation test method of claim 1, wherein the relay matrix further comprises a plurality of pin drivers, the step of controlling the relay matrix to make any two of the signal pins in one of the pin groups electrically connected further comprises providing a simulated power signal to any two of the signal pins in one of the pin groups electrically connected to simulate a power-short condition.

7. The electrical connection defect simulation test method of claim 1, wherein the relay matrix further comprises a plurality of pin drivers, the step of controlling the relay matrix to make any two of the signal pins in one of the pin groups electrically connected further comprises providing a simulated ground signal to any two of the signal pins in one of the pin groups electrically connected to simulate a ground-short condition.

8. An electrical connection defect simulation test system to perform a simulation test on a device under test, wherein the device under test comprises a plurality of pin groups each having a plurality of signal pins, and the device under test is equipped with an electrical connection defect detection technology, the electrical connection defect simulation test system comprises:
    a signal-feeding device to transmit a zero-frequency signal from a signal-feeding device to each of the signal pins to simulate an open condition such that the device under test performs an open test thereon; and
    a relay matrix connected to the signal pins of the pin groups of the device under test to make any two of the signal pins in one of the pin groups substantially electrically connected to simulate a short condition such that the device under test performs a short test thereon.

9. The electrical connection defect simulation test system of claim 8, wherein the pin groups have electrical logic levels different to each other.

10. The electrical connection defect simulation test system of claim 8, wherein the zero-frequency signal is a direct current (DC) signal or a tri-state signal.

11. The electrical connection defect simulation test system of claim 8, wherein the signal-feeding device comprises a probe and a signal generator, the zero-frequency signal is generated by the signal generator and is transmitted to each of the signal pins through the probe.

12. The electrical connection defect simulation test system of claim 8, wherein the signal-feeding device is a boundary scan chip connected to each of the signal pins, the zero-frequency signal is generated by the boundary scan chip.

13. The electrical connection defect simulation test system of claim 8, wherein the relay matrix further comprises a plurality of pin drivers to provide a simulated power signal to any two of the signal pins in one of the pin groups electrically connected to simulate a power-short condition.

14. The electrical connection defect simulation test system of claim 8, wherein the relay matrix further comprises a plurality of pin drivers to provide a simulated ground signal to any two of the signal pins in one of the pin groups electrically connected to simulate a ground-short condition.

* * * * *